United States Patent
Asano et al.

(10) Patent No.: US 7,537,869 B2
(45) Date of Patent: May 26, 2009

(54) EVALUATION OF PATTERN FORMATION PROCESS, PHOTO MASKS FOR THE EVALUATION, AND FABRICATION METHOD OF A SEMICONDUCTOR DEVICE WITH THE EVALUATION PROCESS

(75) Inventors: Masafumi Asano, Kanagawa (JP); Kazuya Fukuhara, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 806 days.

(21) Appl. No.: 11/108,862

(22) Filed: Apr. 19, 2005

(65) Prior Publication Data

US 2005/0244724 A1    Nov. 3, 2005

(30) Foreign Application Priority Data

Apr. 20, 2004    (JP)    ............................ P2004-124328

(51) Int. Cl.
*G03C 5/00*    (2006.01)
*G03F 9/00*    (2006.01)

(52) U.S. Cl. .................... 430/30; 430/396; 430/942; 430/945

(58) Field of Classification Search .................. 430/5, 430/30, 396, 942, 945
See application file for complete search history.

(56) References Cited

U.S. PATENT DOCUMENTS

| 7,264,907 B2 * | 9/2007 | Watanabe ....................... 430/5 |
| 2003/0068565 A1 | 4/2003 | Ki et al. |
| 2004/0023130 A1 | 2/2004 | Yao et al. |
| 2004/0196447 A1 | 10/2004 | Watanabe |
| 2005/0170264 A1 | 8/2005 | Hukuhara |

FOREIGN PATENT DOCUMENTS

JP    2003-100624    4/2003

* cited by examiner

*Primary Examiner*—Christopher G Young
(74) *Attorney, Agent, or Firm*—Finnegan, Henderson, Farabow, Garrett & Dunner, L.L.P.

(57) ABSTRACT

A method for evaluating a pattern formation process includes applying a photoresist on a substrate, transferring a first pattern and a second pattern adjacent to or at least partly overlapped with each other to the photoresist, wherein the first pattern includes a plurality of lines consisting of transparent regions, having the same length and a line-width less than or on the order of wavelengths of visible light, periodically located parallel to one another with end portions aligned on both sides thereof, and the second pattern comprises a transparent region having a larger area compared with each of the lines, and determining, in a first pattern formed on the substrate with the first pattern transferred to the photoresist, by an optical means, an amount of shorting of the lines in a direction parallel to the line.

16 Claims, 7 Drawing Sheets

PHOTOMASK A (110nmL/S)

PHOTOMASK B (10μm×5μm)

PHOTORESIST PATTERN

IMAGE THROUGH OPTICAL MICROSCOPE

DEPENDENCY OF A CHANGE IN LENGTH OF THE LINES UPON THE DISTANCE FROM A LARGE AREA PATTERN IN VARIOUS EXPOSING APPARATUSES

LATENT IMAGE

IMAGE THROUGH OPTICAL MICROSCOPE FOR LATENT IMAGE

PHOTORESIST PATTERN AFTER DEVELOPMENT

BEFORE APPLYING PHOTORESIST

AFTER APPLYING PHOTORESIST

PHOTOMASK C

PHOTORESIST PATTERN

IMAGE THROUGH OPTICAL MICROSCOPE

DISTANCE FROM END OF ARRAY

DISTANCE FROM END OF ARRAY

DEPENDENCY OF A LINE-WIDTH UPON
THE DISTANCE FROM THE END OF AN ARRAY

EVALUATION OF PATTERN FORMATION PROCESS, PHOTO MASKS FOR THE EVALUATION, AND FABRICATION METHOD OF A SEMICONDUCTOR DEVICE WITH THE EVALUATION PROCESS

CROSS REFERENCE TO RELATED APPLICATIONS AND INCORPORATION BY REFERENCE

This application is based upon and claims the benefit of priority from prior Japanese Patent Application P2004-124328 filed on Apr. 20, 2004, and the entire contents thereof are incorporated herein by reference.

BACKGROUND OF THE INVENTION

1. Field of the Invention

The present invention relates to a method for evaluating pattern formation processes and a photomask for the evaluation, specifically to a method for evaluating pattern formation processes applied primarily to the analysis of variations in line-width during an exposure process, a photoresist process, a dry-etching process, etc. in manufacturing semiconductor devices and a photomask for the evaluation.

2. Description of the Related Art

Recently, various effects of the periphery around the pattern concerned has been a problem in a pattern formation process for semiconductor devices having fine integrated structure particularly of the order of sub-micron.

For example, when there is a large region without any patterns in the vicinity of the fine patterns concerned, and especially when the region is a transparent region formed by the exposure of light transmitted in a photolithography process, the variations in dimension of the fine patterns due to micro-flare at the time of exposure has been a problem.

Referring now to FIGS. 14A and 14B the phenomenon of the micro-flare above will be briefly described. FIG. 14A shows part of a reticule on which patterns of a device are drawn. In this simplified example, the patterns of the device are an arrangement of a plurality of line patterns 11 having a line-width and an interval less than or on the order of sub-micron. As shown in FIG. 14B, it is a frequently observed phenomenon in a photoresist pattern after light exposure that a line-width of each line pattern 11 varies as the line pattern goes far from the end of a cell array 18 into the interior of the array. The reason is considered that an exposure light irradiated onto the region without any patterns, namely, onto the vicinity of the cell array 18, has leaked out into the interior of the cell array 18 due to scattering in a projection optical system.

In order to manufacture highly reliable semiconductor devices, fine patterns must be formed as designed. It is desired for the line patterns 11 to be formed as originally intended as to the line-width and length thereof and uniform within the entire pattern.

When fine patterns are formed, influence from the surroundings of the patterns is not only from the effect of micro-flare. For example, there is a lot of such pattern formation processes that the transfer medium on which fine patterns are formed has certain unevenness in the surface, steps for instance, due to the influence of the undercoat thereof which has already been existing at the time of the pattern formation process. One of the examples is such a manufacturing process that a photolithography process is performed by further applying a photoresist onto a patterned polycrystalline silicon film which has been deposited on an oxide film. In such a situation, the photoresist film, which is a transfer medium for fine patterns, cannot have a smooth surface, but have an uneven surface, and is processed through each step of light exposure, etching, and development.

Further, it is likely that when regions from which a photoresist is removed is concentrated at a certain limited area, chemical substance formed through the reaction of the photoresist with a developer flows out in a small quantity into a surrounding in the process of development, or etching of the photoresist, resulting in undesirable influence on fine patterns to be formed in the surrounding of the area.

The influence from surroundings due to micro-flare, etc. is a very significant problem. For example, Japanese Patent Application Laid-Open No. 2003-100624 discloses a method for examining the effect of occurrence of flare due to an exposure apparatus. It is reported that the method includes preparing a photomask on which a plurality of fine line patterns with a line-width of 150 nm are spaced 150 nm apart; transferring the pattern on the photomask onto a photoresist by a photolithography process; and measuring a line-width of each fine line pattern for all the transferred line patterns, based on the knowledge that the line-width after the transfer will be changed if flare had occurred.

However, in such a conventional method, it takes a lot of time and labor to measure every line-width of fine patterns and thus the method is particularly inefficient in the development of new semiconductor devices where efficiency is required. Additionally, errors could be relatively large in each measurement of fine patterns.

SUMMARY OF THE INVENTION

An aspect of the present invention inheres in a method for evaluating a pattern formation process, the method including applying a photoresist on a substrate; transferring a first pattern and a second pattern adjacent to or at least partly overlapped with each other to the photoresist, wherein the first pattern includes a plurality of lines consisting of transparent regions, having the same length and a line-width less than or on the order of wavelengths of visible light, periodically located parallel to one another with end portions aligned on both sides thereof, and the second pattern comprises a transparent region having a larger area compared with each of the lines; and determining, in a first pattern formed on the substrate with the first pattern transferred to the photoresist, by an optical means, an amount of shortening of the lines in a direction parallel to the line.

Another aspect of the present invention resides in a method for evaluating a pattern formation process, the method including applying a photoresist on a substrate; transferring a first pattern and a second pattern adjacent to or at least partly overlapped with each other to the photoresist, wherein the first pattern includes a plurality of lines consisting of transparent regions, having line-widths less than or on the order of wavelengths of visible light, periodically located parallel to one another in a finite section, and the closer to a periphery of the section the lines are located, the smaller line-widths thereof are, and the second pattern comprises a transparent region having a larger area compared with any of the lines; and determining, in a first pattern formed on the substrate with the first pattern transferred to the photoresist, by an optical means, an amount of withdrawal of the section in a direction perpendicular to the lines.

Yet another aspect of the present invention resides in a method for evaluating a pattern formation process, the method including applying a photoresist on a substrate with an uneven surface; transferring a first pattern to the photoresist, wherein the first pattern includes a plurality of lines consisting of transparent regions, having the same length and a line-width less than or on the order of wavelengths of visible light, periodically located parallel to one another with end portions aligned on both sides thereof; and determining, in a first pattern formed on the substrate with the first pattern transferred to the photoresist, by an optical means, an amount of shortening of the lines in a direction parallel to the line.

Further another aspect of the present invention resides in a method for evaluating a pattern formation process, the method including applying a photoresist on a substrate with an uneven surface; transferring a first pattern to the photoresist, wherein the first pattern includes a plurality of lines consisting of transparent regions, having line-widths less than or on the order of wavelengths of visible light, periodically located parallel to one another in a finite section, and the closer to the periphery of the section the lines are located, the smaller line-widths are; and determining, in a first pattern formed on the substrate with the first pattern transferred to the photoresist, by an optical means, an amount of withdrawal of the section in a direction perpendicular to the lines.

An additional aspect of the present invention resides in a method for manufacturing a semiconductor device, the method including applying a photoresist on a substrate; transferring a first pattern and a device pattern to the photoresist, wherein the first pattern includes a plurality of lines consisting transparent regions, having the same length and a line-width less than or on the order of wavelengths of visible light, periodically located parallel to one another with end portions aligned on both sides thereof; determining, in a first pattern formed on the substrate with the first pattern transferred to the photoresist, by an optical means, an amount of shortening of the end portions in a direction parallel to the line; and selectively etching the substrate with the device pattern transferred to the photoresist to form the device pattern in the substrate.

Another additional aspect of the present invention resides in a method for manufacturing a semiconductor device, the method including applying a photoresist on a substrate; transferring a first pattern and a device pattern to the photoresist, wherein the first pattern includes a plurality of lines consisting of transparent regions, having line-widths less than or on the order of wavelengths of visible light, periodically located parallel to one another in a finite section, and the closer to the periphery of the section the lines are located, the smaller line-widths thereof are; determining, in a first pattern formed on the substrate with the first pattern transferred to the photoresist, by an optical means, an amount of withdrawal of the section in a direction perpendicular to the lines; and selectively etching the substrate with the device pattern transferred to the photoresist to form the device pattern in the substrate.

Further another additional aspect of the present invention resides in a photomask for evaluating a pattern formation process, the photomask having a first pattern and a second pattern adjacent to or at least partly overlapped with the first pattern, wherein the first pattern includes a plurality of lines consisting of transparent regions, having line-widths less than or on the order of wavelengths of visible light, periodically located parallel to one another in a finite section, and the closer to a periphery of the section the lines are located, the smaller line-widths thereof are and the second pattern comprises a transparent region having a larger area compared with any of the lines.

Yet another additional aspect of the present invention resides in a set of photomasks for evaluating a pattern formation process, the set including a first photomask having a first pattern and a second photomask having a second pattern, wherein the first pattern includes a plurality of lines consisting of transparent regions, having line-widths less than or on the order of wavelengths of visible light, periodically located parallel to one another in a finite section, and the closer to a periphery of the section the lines are located, the smaller line-widths thereof are, and the second pattern comprises a transparent region having a larger area compared with any of the lines.

DETAILED DESCRIPTION OF THE INVENTION

Figure 1A:
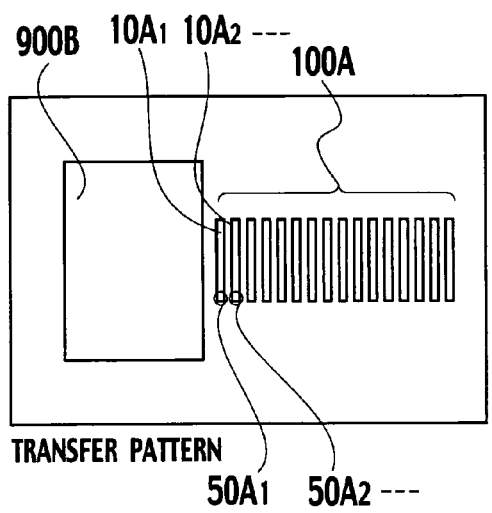
FIGS. 1A and 1B show a transfer pattern of the first embodiment.

In the following, a method for evaluating pattern formation processes and a photomask for the evaluation relating to the embodiments of the present invention will be described referring to the drawings. However, it should be noted that the drawings are only schematic, and relationship between width and length of a pattern, its shape, change in length, the ratio of thickness among layers, the ratio of length to thickness, etc. are not always similar to those of the real.

First Embodiment

In short, a feature of the present invention is a method for evaluating pattern formation processes performed by applying a photoresist onto a substrate; transferring a fine pattern including a plurality of lines onto the surface of the photoresist where another pattern having a transparent region with a large area transmissible to an exposure light exists, or the photoresist has an uneven portion; extracting a contour of the pattern formed on the substrate using the fine pattern transferred onto the photoresist; and measuring a span of the contour along the entire contour according to the information about the extracted contour. The extraction of the contour is typically performed through observation with an optical inspection apparatus, and how the span of the contour varies depending on the distance from the uneven portion or the other pattern is examined. By means of the above method, flare from an exposure apparatus and a micro-loading effect due to development/etching can be easily monitored.

In the first embodiment in which the above features of the present invention are more concretely realized, as shown in FIG. 1A an evaluation pattern to be transferred onto a transfer medium comprises both a first pattern 100A including a plurality of lines $10A_1$, $10A_2$, and so on, which have the same length and are periodically located parallel to one another with aligned end portions $50A_1$, $50A_2$, . . . , and another pattern 900B consisting of a transparent region with a large area transmissible to an exposure light.

Figure 7A:
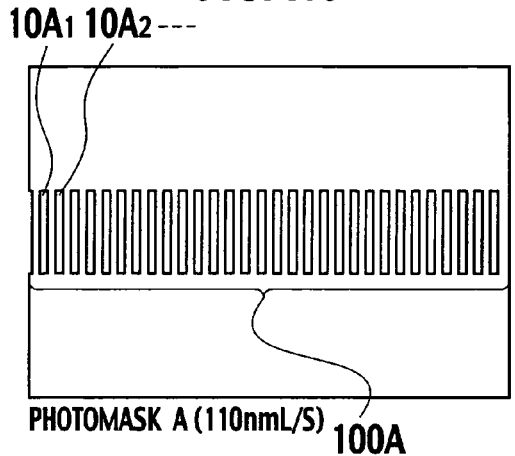
FIGS. 7A and 7B respectively show photomask A and photomask B exemplified in the first embodiment.
Figure 7B:
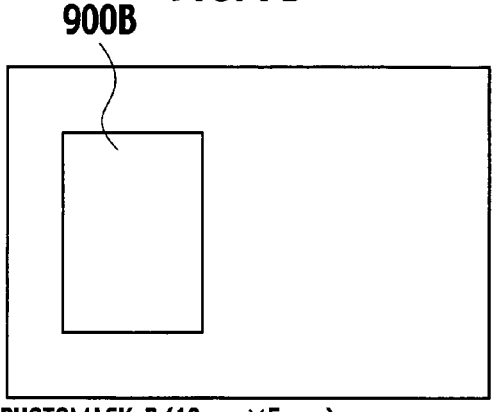

When these patterns are transferred by light-exposure onto the transfer medium, namely a substrate, the above pattern corresponds to a design for a photomask. However, the first pattern 100A and the pattern 900B need not necessarily be exposed to the light at the same time, and they can be on separate photomasks as shown in FIG. 7A and FIG. 7B for example. That is to say, it will be sufficient that the design shown in FIG. 1A may be transferred onto the transfer medium as a result of a single exposure when the design as shown in FIG. 1A is formed on one photomask, and two exposures when the designs are separately formed on plural photomasks.

When a plurality of exposures are performed using a plurality of photomasks, the order of the photomasks used in the exposure is not problematic, but any photomasks can be chosen for the first exposure. Further, the fine pattern 100A and the pattern 900B are transferred onto the same transfer medium, and the pattern 900B is preferably located adjacent to or overlapped with the fine pattern 100A in order to detect clearly the effect of the process, such as micro-flare. When both patterns are located adjacent to each other, the distance between patterns is preferably almost on the order of or less than the line-width of the line patterns composing the pattern 100A. When both patterns are located without any overlap, the pattern 900B is preferably located perpendicular to the longitudinal direction of a plurality of the lines $10A_1$, $10A_2$, . . . , at a position not overlapping with the first pattern 10A, and adjacent to the first pattern 100A. Pattern formation processes can also be evaluated in the electron-beam direct writing lithography, which do not use any photomasks. In this case, it will be sufficient that the pattern shown in FIG. 1A may be written onto a substrate as the transfer medium as a result of sequentially writing the lines one by one using an electron beam.

In the first pattern 10A, the structure of the pattern must be fine. If the pattern is not fine, the delicate effect of the process, such as micro-flare due to an exposure apparatus cannot be reflected on the change in the shape of the transfer pattern. There has been a problem that a bad effect of the process occurs, for one thing, in the recent manufacturing process of fine semiconductor devices. The first pattern 100A is an intended realization of such a recent manufacturing process for the evaluation.

Concretely, with regard to the degree of fineness, the fine pattern consisting of the lines $10A_1$, $10A_2$, . . . , composes the first pattern 10A, preferably has a line-width of about 30 nm-150 nm and a spacing in the fine pattern, namely, an interval between each line of about 30 nm-150 nm. The range of wavelengths of a visible radiation is approximately 400 nm-700 nm, and consequently fine patterns such as individual lines cannot be observed separately by an optical means when the interval in the fine pattern is so short as described above.

The pattern 900B corresponds, for example, to an electrode pattern where exposed regions are concentrated at a definite portion. Typically, the pattern is in the shape of a square, a circle, an ellipse, etc. suitable for transmitting a large amount of luminous energy. However, such a pattern with fine details can be employed for the pattern 900B as far as a similar effect is obtained because the pattern has an adequate size transparent area within a restricted area. When the pattern 900B is defined by area, the pattern 900B preferably has the ratio of a transparent region of at least 50% or more per unit area and also has an area of at least 400 $\mu m^2$ or more as an integrated region. If the pattern 900B only has the transparent region as above, it is suitable for evaluating the effect of micro-flare frequently becoming evident in the recent exposure apparatus. When the area or the ratio of the transparent region is too small, the effect of micro-flare cannot be detected.

Figure 2A:
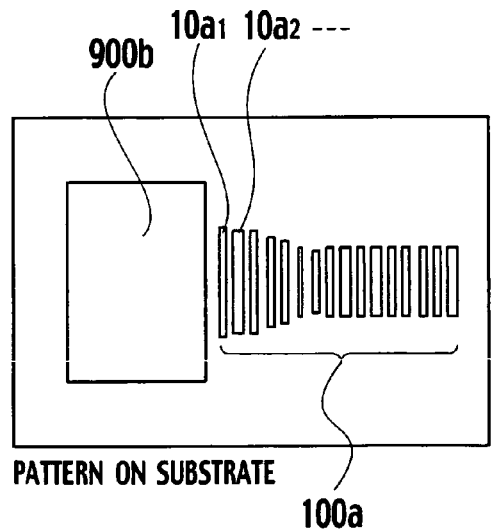
FIG. 2A shows a pattern transferred onto a medium in accordance with the first embodiment.

The phenomenon, which can be directly evaluated, is the change in length or line-width, dependent on the process, of the lines $10a_1$, $10a_2$, . . . of the first pattern 100a shown in FIG. 2A. Even if the lines $10A_1$, $10A_2$, . . . in the first pattern 100A are always designed with the same dimensions, variations in length or line-width of the lines $10a_1$, $10a_2$, . . . in the first pattern 100a will occur due to various factors during the process when such a large region as the pattern 900B exists in the vicinity of the first pattern. For example, the factors may be micro-flare due to an exposure apparatus, or a micro-loading effect during the development or etching process. To sum up, even if the design shown in FIG. 1A is transferred to a substrate through a light exposure, the actual pattern on the photoresist as shown in FIG. 2A or the pattern after the etching process is considered to change depending on the distance of the portion of the pattern 100a from the pattern 900b. Concretely, the length or line-width of the lines $10a_1$, $10a_2$, . . . varies. Actually, the changes occur at the same time, and the photoresist pattern or the etching pattern formed with the photoresist pattern for an underlying layer may be greatly different from the design as shown in FIG. 2A.

Figure 2B:
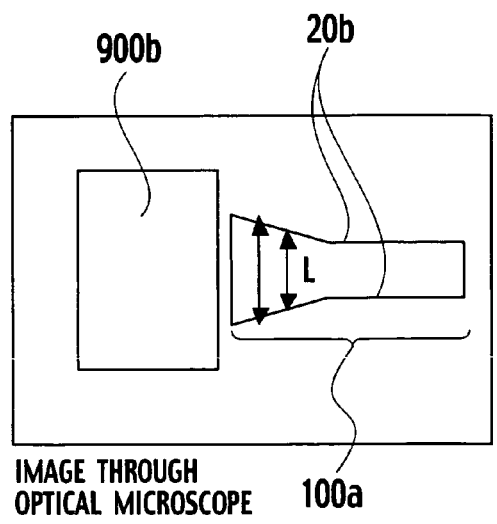
FIG. 2B shows an image observed by an optical microscope, of a pattern transferred onto the medium in accordance with the first embodiment.

The first embodiment is a method for efficiently examining the dependency of the change in line length of lines $10a_1$, $10a_2$, . . . on the distance from the other pattern 900b. The measurement is performed by extracting a contour 20a of the region of the first pattern 100a formed with the first pattern 100A. Concretely, this can be performed using a photograph by an optical microscope or the like. When the line-width of the lines $10a_1$, $10a_2$, . . . composing the first pattern 100a is less than the critical resolution of an optical monitor, the contour 20a of the entire first pattern 100a can be automatically obtained as shown in FIG. 2B. Once the contour 20a is extracted, measurement of the values equal to the line lengths of the lines $10a_1$, $10a_2$, ... will be easily performed by image analysis.

By optical observation means such as optical microscope, instead of the local observation by an electron microscope etc., the information about the entire pattern can be collectively obtained. Moreover, the above method does not acquire more data than necessary such as information about a length of each individual line, and only necessary and sufficient data are utilized as the processed subject for image analysis. Therefore, the method of the first embodiment is much more efficient compared with conventional methods.

Figure 1B:
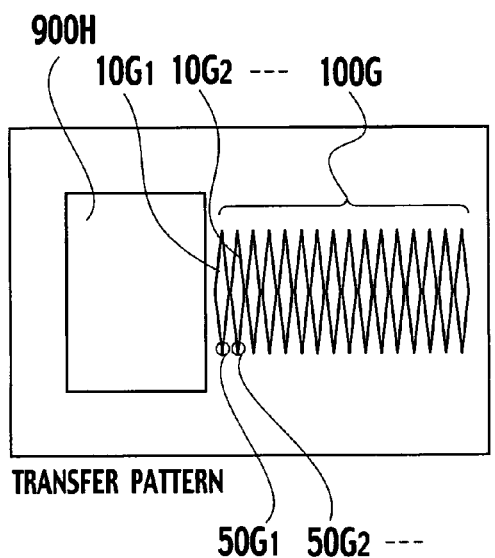

In addition, each line $10A_1$, $10A_2$, ... included in the first pattern 100A can be configured to have such line-width as to vary in the longitudinal direction of each line $10A_n$ (n=1, 2, ...) and to be smaller at the end portion $50A_n$ of the line $10A_n$ than at any other portion. As a typical example of the above, a first pattern 100G including wedge-shaped lines $10G_1$, $10G_2$, ... is shown in FIG. 1B. Using the first pattern 100G including wedge-shaped lines $10G_1$, $10G_2$, ..., change in line length of the lines $10G_n$ will be made more enhanced on a pattern transferred, because the pattern is typically designed for each line $10G_n$ (n=1, 2, ...) in order to become more slender as it goes closer to the end of the line, resulting in more sensitive reaction to leaked exposure light. Thus, a change in the length of the lines $10G_n$ can be more sensitively measured than in the case in FIG. 1A, where the first pattern 100A including the lines $10A_1$, $10A_2$, ... with a constant line-width is employed.

As a pattern formed medium, namely, a transfer medium includes an applied photoresist film, and an underlying material to be patterned using the photoresist pattern as a photomask. In semiconductor manufacturing processes, the underlying material is typically an oxide film or a semiconductor film. Further a latent image in a photoresist before developing the photoresist can be a subject of the evaluation.

In order to evaluate micro-flare due to an exposure apparatus and change of a device pattern depending on a photoresist process, the following experiment was carried out according to the first embodiment.

After applying, in order, an antireflection film and a photoresist onto a silicon (Si) substrate, the first pattern 100A was transferred onto the surface of the photoresist with an ArF exposure apparatus using the photomask A shown in FIG. 7A. The first pattern 100A is such that a plurality of lines $10A_1$, $10A_2$, ... of the same shape having a length of 10 µm and a line-width of 110 nm are spaced at the same intervals of 110 nm.

Sequentially, another pattern 900B was transferred partly overlapping on the first pattern 100A, which had been previously printed with the photomask A, using an ArF exposure apparatus with the photomask B shown in FIG. 7B. The other pattern 900B is a large pattern in the shape of a 10 µm×15 µm rectangle substantially 100% transparent to the exposure light.

Figure 10A:
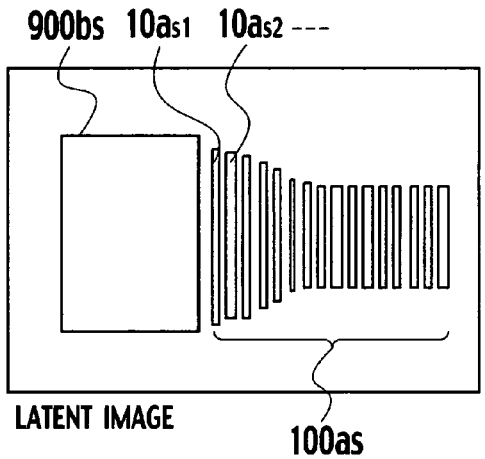
FIG. 10A shows a latent image of photoresist patterns obtained by using photomask A and photomask B.

By post exposure baking (PEB), the latent first pattern $100a_S$ and the latent other pattern $900b_S$ shown in FIG. 10A were obtained. The latent first pattern $100a_S$ and the latent other pattern $900b_S$ are formed through chemical change of the photoresist film caused by the exposure. A practical photoresist pattern is obtained by further conducting a development process. In a latent image, the refractive index of a photoresist film and/or thickness of the film are changed on a minute scale, depending on the pattern. Therefore, the pattern can be detected through an optical inspection apparatus such as an optical microscope.

Figure 10B:
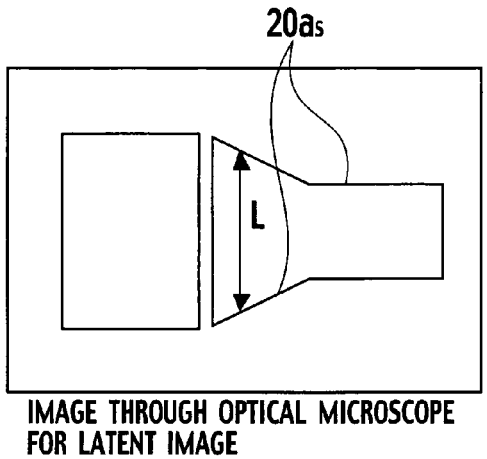
FIG. 10B shows an image observed through an optical microscope, of the latent image.

An image of the latent pattern was obtained using an optical microscope. Through an optical microscope, fine periodic patterns which composes a mark on the photomask cannot be separately observed because of lack of resolution. Therefore, an image of a contour $20a_S$ of the entire pattern shown in FIG. 10B was obtained, and a span L shown by an arrow in the figure was measured from the image. The span corresponds to the length of the lines $10a_{S1}$, $10a_{S2}$, ... of the line pattern.

Figure 10C:
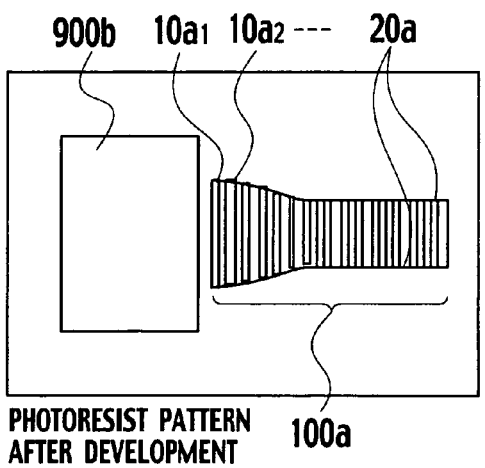
FIG. 10C schematically shows photoresist patterns after development, obtained by using photomask A and photomask B.

A photoresist pattern shown in FIG. 10C was obtained by the process of development to the wafer substrate in which the latent image had been observed. After an image of a contour $20a_S$ of the entire pattern was obtained by observing the photoresist pattern through the optical microscope in a similar manner to the observation of the latent pattern, a span L corresponding to the length of the lines $10a_1$, $10a_2$, ... was measured along the contour $20a_S$.

Figure 11:
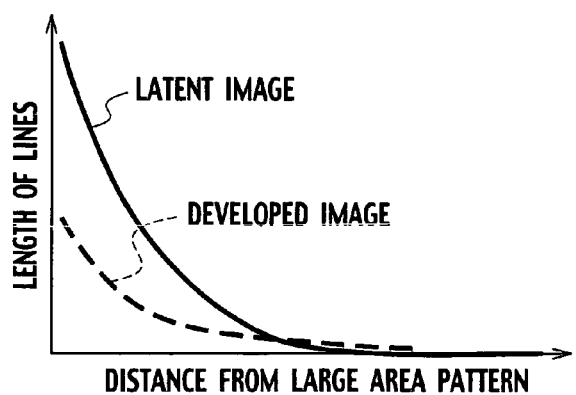
FIG. 11 shows changes in length of lines in a line pattern depending on distances from a large area pattern, obtained from a latent image of a photoresist and a photoresist pattern after development.

FIG. 11 shows a change in length of the lines $10a_{Sn}$ and $10a_n$ along a relative distance: taking as the ordinate, lengths of both lines $10a_{Sn}$ and $10a_n$ measured about both the image of the contour $20a_S$ of the latent pattern obtained through an optical microscope and the image of the contour 20a of the photoresist pattern; and taking a relative distance from the other rectangle-shaped pattern $900b_S$ and 900b on the abscissa. As seen from FIG. 11, with regard to the latent image, the length of the lines $10a_{Sn}$ significantly increases as the line approaches the other rectangle-shaped large-area pattern $900b_S$. However, such a tendency of increase is mitigated in the photoresist pattern after development. As a result of the above experiment, it is concluded that the developing process has an effect of canceling micro-flare during exposure.

Further, conventional measurement using a scanning electron microscope (SEM) was also tried. But it was difficult to measure a latent pattern and consequently it was impossible to obtain similar data to the above.

Since patterns are observed using an optical means according to the first embodiment, the effect of the surrounding circumstances such as flare on fine patterns can be evaluated even at the stage of a latent image. Moreover, by conducting the evaluation in each step of exposing, post exposure baking (PEB), development, and etching to examine the effect of each process, it is possible to determine in which step the effect is largest.

Various means such as an optical microscope, image pickup by a CCD camera, and image analysis of the picked-up image using a computer can be used as an optical means.

According to the first embodiment, a large region on a substrate can be collectively incorporated into an image and variations in a pattern can be obtained by analyzing the image. Therefore, the time necessary for evaluation will be shorter than that for the conventional measurement using an SEM. Further, such an effect, as mentioned above, is particularly remarkable for comparing a plurality of exposure apparatuses as shown in the following.

In order to examine the difference in occurrence of micro-flare corresponding to the difference among exposure apparatuses when pattern formation is performed using different exposure apparatuses, an etching process and the evaluation were carried out as described below.

After applying, in order, an antireflection film and a photoresist onto a Si substrate, the first pattern 100A was transferred on the surface of the photoresist with an Argon-Fluorine (ArF) exposure apparatus using the photomask A with the first pattern 100A shown in FIG. 7A. The first pattern 100A is such that a plurality of the lines $10A_n$ (n=1, 2, ...)

with the same shape having a length of 10 μm and a line-width of 110 nm are spaced at the same interval of 110 nm.

Sequentially, another pattern 900B was printed partly overlapping onto the first pattern 100A, which had been previously printed with the photomask A, using an ArF exposure apparatus with the photomask B, which has the other pattern 900B shown in FIG. 7B. The other pattern 900B is a large pattern in the shape of a 10 μm×15 μm rectangle substantially 100% transparent to the exposure light. By baking after the exposure (PEB) and developing, the first pattern 100a and pattern 900b on the photoresist shown in FIG. 8A were obtained.

Next, an image of the photoresist pattern was obtained using an optical microscope. Through an optical microscope, fine periodic patterns composing a mark on the photomask cannot be separately observed because of lack of resolution. Therefore, an image as shown in FIG. 8B consisting of a contour 20a of the entire pattern was obtained, and a span L shown by an arrow in FIG. 8B was measured from the image. The span corresponds to the length of the lines $10a_1$, $10a_2$, ... of the line pattern.

Figure 8A:
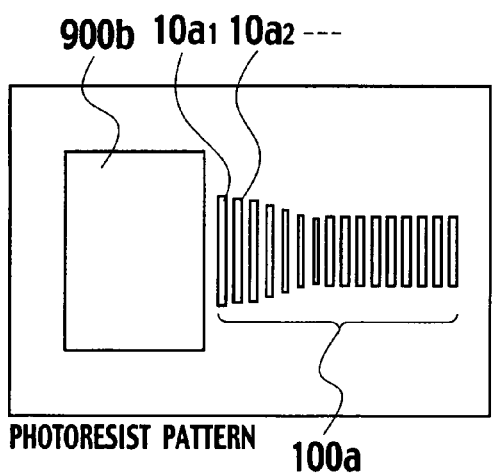
FIG. 8A shows photoresist patterns obtained by using photomask A and photomask B.
Figure 8B:
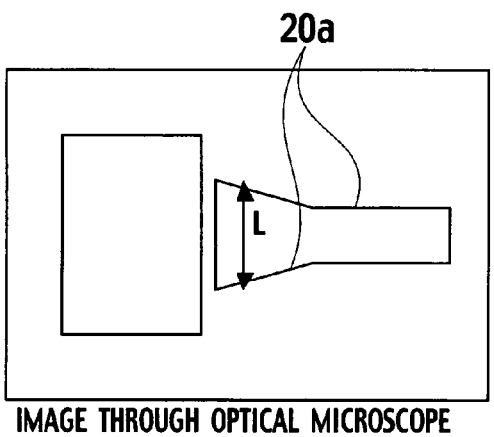
FIG. 8B schematically shows images observed through an optical microscope, of photoresist patterns obtained by using photomask A and photomask B.

In comparison with the conventional technology, direct observation of the photoresist pattern shown in FIG. 8A was tried using an SEM. Specifically, through this direct observation, the line-width of each line was measured sequentially starting from the neighborhood of the other rectangle-shaped pattern 900b.

The preceding operations were repeated for different exposure apparatuses #1, #2, and #3.

Figure 9:
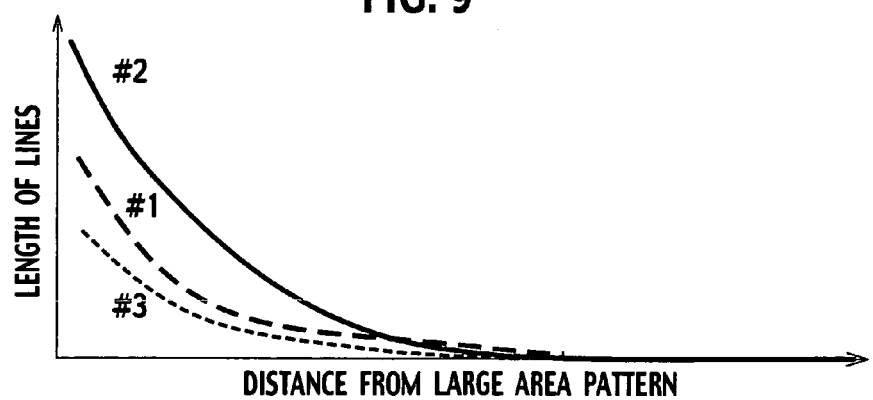
FIG. 9 shows changes in length of lines of a line pattern depending on a distance from a large area pattern.

FIG. 9 shows a change in length of the lines $10a_1$, $10a_2$, ... along a relative distance: taking as the ordinate, length of the lines $10a_1$, $10a_2$, ... measured about the image of the photoresist pattern obtained through an optical microscope; and taking a relative distance from the other rectangle-shaped pattern 900b on the abscissa. The amount of change in length of the lines $10a_n$ (n=1, 2, ... ) is largest in the case where exposure was performed using the exposure apparatus #2, and it is concluded that the apparatus is liable to have a large effect on the size of the first pattern 100a adjacent to the other pattern 900b.

Additionally, a similar tendency of a change in size was obtained by conventionally measuring the line-width of each line $10a_n$ using an SEM.

Second Embodiment

The second embodiment is different from the first embodiment in that the evaluation of pattern formation processes is performed using a "pattern" where the pattern to be transferred onto a transfer medium has not only a distinction between white/black, namely, as to the presence/absence of the pattern but also a finite transmittance less than 100% and at the same time the transmittance is distributed in a photomask, for example, when a photomask is composed of the pattern.

Figure 3A:
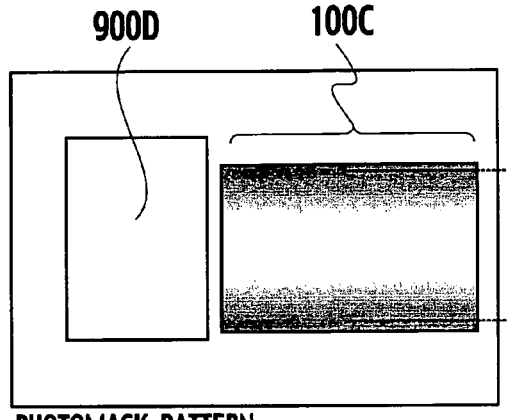
FIGS. 3A and 3C show patterns to be transferred in accordance with the second embodiment.
Figure 3B:
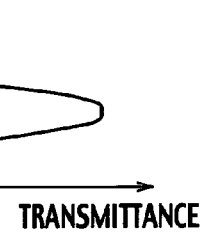
FIGS. 3B and 3D show variations in transmittance in the patterns in accordance with the second embodiment.
Figure 4A:
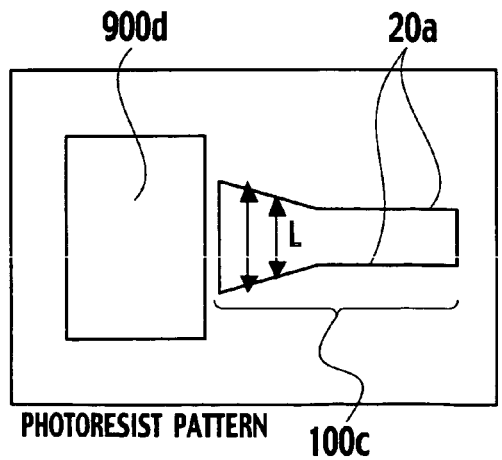
FIGS. 4A and 4B shows patterns transferred onto medium in accordance with the second embodiment.
Figure 4B:
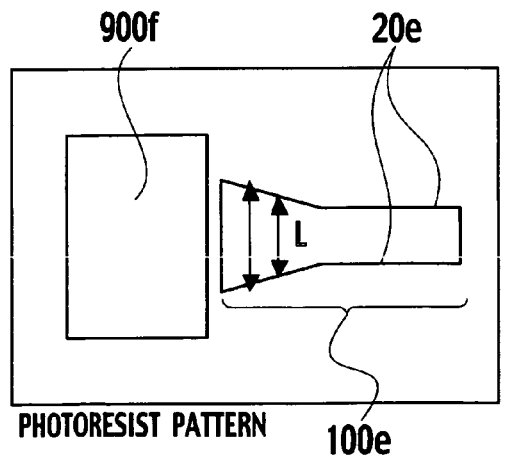

A typical example of the pattern described above is shown in FIG. 3A. FIG. 3A shows an evaluation pattern formed on a photomask. The evaluation pattern has a first pattern 100C adjacent to another pattern 900D, which is exemplified in the first embodiment and consists of a transparent region transparent to an exposure light. The transmittance of the first pattern changes continuously along a given direction and is constant in the direction perpendicular to the given direction. The pattern 900D may be overlapped with, instead of being adjacent to, the first pattern 100C. The change in transmittance along the given direction in which the transmittance changes may be continuous as shown in FIG. 3A or may be discrete. When a leaking light occurs (micro-flare) from the adjacent other pattern 900D, the effective amount of exposure energy increases as the first pattern comes closer to the other large area pattern 900D. Therefore, a photoresist pattern as shown in FIG. 4A is obtained by observing a transferred pattern 100c of the first pattern 100C through an optical means. The effect of the process environment such as those of micro-flare can be efficiently observed by sequentially measuring the spans L indicated by the arrows on the basis of the image of the contour 20a of the photoresist pattern.

Particularly in the example shown in FIG. 3A, the photomask pattern is such that the transmittance does not change in the lateral direction of the first pattern 100C and the transmittance in the longitudinal direction is largest at the center and decreases toward the periphery of the pattern. Therefore, when a scattering light from an exposure apparatus occurs, the scattering light received by the periphery of the first pattern 100c compensate delicately the level of exposure at the periphery. Thus, the process environments such as scattering light may be reflected more sensitively in the amount of withdrawal of the pattern, or the amount of extension if measured in the opposite direction, at the periphery where the transmittance of the photomask is reduced.

Figure 3C:
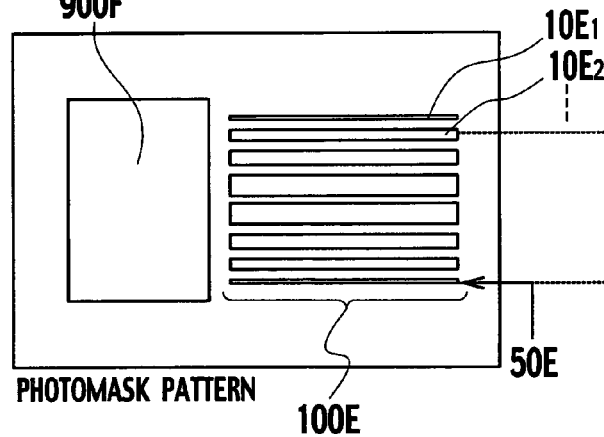

A first pattern 100E as shown in FIG. 3C is a pattern for more simply realizing the second embodiment. A pattern 900F is another pattern including a transparent region transparent to exposure light, and there is not much difference from the pattern 900D, the pattern 900B, or the pattern 900H.

Figure 3D:

The first pattern 100E is a pattern having a plurality of parallel lines $10E_1$, $10E_2$, ... arranged at a given period P and line-widths of the lines $10E_1$, $10E_2$, ... are changed continuously or discretely in the direction of the period P. The pattern 100E approximately provides a test pattern with varying transmittance by way of each location and line-width of lines $10E_1$, $10E_2$, ... The distribution of transmittance as approximately shown in FIG. 3D is obtained by calculating the amount of transmitted exposure light per a finite given area for the first pattern 100E, for example, and a similar optical effect to that for the first pattern 100C can be obtained.

Additionally, the period P preferably satisfies the following condition:

$$P<\lambda/[NA(1+\sigma)] \quad (1)$$

where λ is the wavelength of the exposure light, NA is the numerical aperture of a lens, and σ is a coherence factor indicating the amount of illumination. When the above condition is satisfied, fine lines $10E_1$, $10E_2$, ... on the photomask are not resolved on the transfer medium and act as a filter for controlling transmittance. The period P is approximately in the range of 50 nm to 200 nm. The line-width preferably changes in the range from 20% to less than 100% of the period. As mentioned in the description of the first pattern 100C, high measurement sensitivity is preferably obtained when the location and the change in line-width of the lines $10E_1$, $10E_2$, ... are configured in order for the amount of transmitted exposure light per unit area to decrease toward the periphery of the pattern. For example, the closer to the periphery the line is located, the smaller the line-widths. In the case mentioned above, the interval between the first pattern 100E and the pattern 900F is preferably less than or almost equal to the line-width of the line $10E_n$ disposed at the center of the first pattern 100E.

Further, it is considered that the second embodiment is not fundamentally different from the first embodiment in the fact that the pattern 900D and the first pattern 100C as well as the pattern 900F and the first pattern 100E need not be exposed at the same time, characteristics such as the area, the shape of the pattern 900D or 900F including the transparent regions, the interval between the patterns, the phenomenon employed as a subject for evaluation, the fact that the evaluation can be done efficiently by analyzing the image obtained through an optical means, the available pattern formation medium, and the optical means for observation.

Third Embodiment

The third embodiment is characterized in that the conventionally used overlapping-gap inspection device for so-called "displacement" evaluation in a pattern transfer process has been improved for the method of the present invention for evaluating pattern formation processes. Therefore, the basic working-effect and features of the invention of the first and second embodiment can be applied, basically as they are, to those of the present embodiment.

Figure 5:
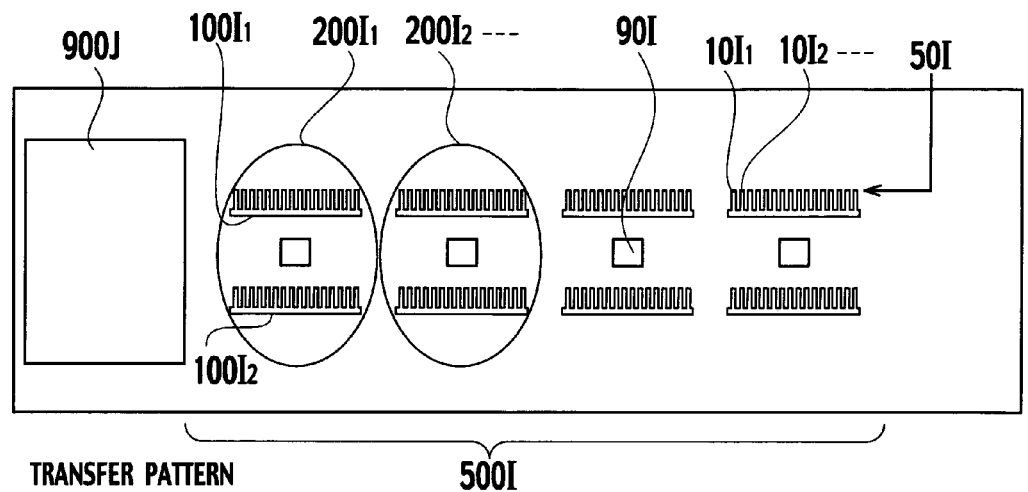
FIG. 5 shows a pattern to be transferred in accordance with the third embodiment.

An evaluation pattern of the third embodiment, as illustrated in FIG. 5, can be generally depicted as a pattern 500I with a matrix arrangement comprising patterns $200I_1$, $200I_2$, ... obtained by transferring a plurality of pair-patterns 200Ij in a direction perpendicular to the longitudinal direction, namely in the lateral direction of the figure. Each pair-pattern 200Ij includes $100I_{1j}$ and $100I_{2j}$ (j=1, 2, ... ), comprises two or more of a comb-shaped first pattern 100I arranged in the longitudinal direction of lines $10I_1$, $10I_2$, ... The comb-shaped first pattern 100I includes a plurality of lines $10I_1$, $10I_2$, ... extending in the longitudinal direction, and arranged laterally parallel with one another. The pattern 900J is a large area pattern comprising a transparent region transparent to an exposure light as already described in the first embodiment and the second embodiment.

First, a plurality of the first patterns 100I or the pair-patterns 200I are transferred onto a transfer medium. The pattern 900J is transferred simultaneously with or separately from the transfer of the first pattern 100I or the pair-pattern 200I onto the first pattern 100I overlapped therewith, or onto the left side of the pair-pattern 200I located at the left end in FIG. 5 and adjacent to the pair-pattern, or onto the right side of the pair-pattern 200I located at the right end in FIG. 5 and adjacent to the pair-pattern. FIG. 5 shows the example where the pattern 900J is transferred onto the left side.

As part of the steps with an overlapping-gap inspection device, the step of obtaining the location of the center of the pair-pattern 200i formed on the substrate with the pair-pattern 200I will follow the preceding steps. Due to the effect of the other pattern 900J, generally, the closer to the other pattern 900j the pair-pattern 200i is, the larger the displacement of the location of the center of the pair-pattern 200i is in the longitudinal direction of the "teeth" of the comb-shaped first pattern 100i. For example, by obtaining the dependency of the displacement of the location of the pair-pattern 200i center upon distance from the other pattern 900j formed on the transfer medium it will be possible to evaluate how micro-flare affects the first pattern 100i at each location according to the positional relationship with the other large-area pattern 900J. Obtaining the "displacement" can be automatically conducted by using a known overlapping-gap inspection device.

Figure 6:
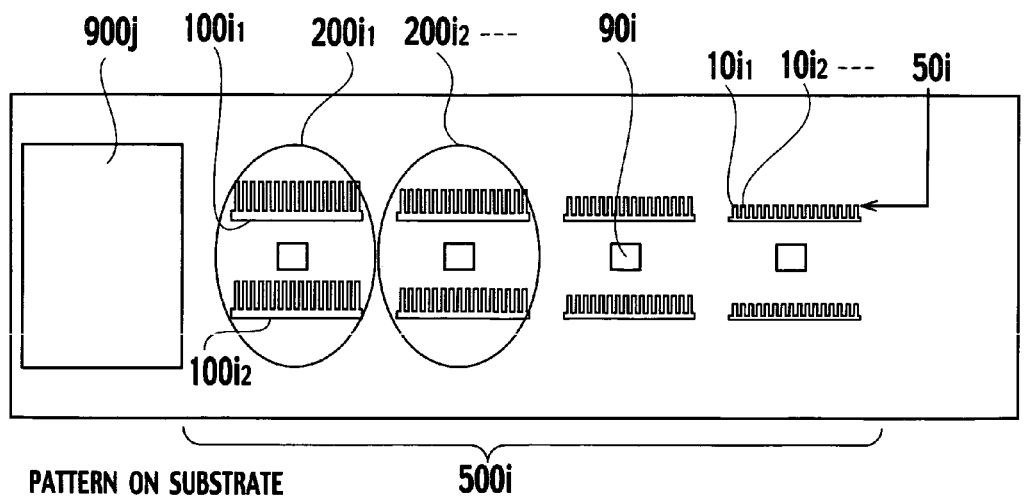
FIG. 6 shows an example of a pattern transferred onto a medium in accordance with the third embodiment.

To perform with ease the evaluation using the above overlapping-gap inspection device, it is preferable that each of the pair-patterns $200I_1$, $200I_2$, ... , as shown in FIG. 5 has a reference mark 90I in the center of the comb-shaped patterns arranged in the upper and the lower rows. Via the processes such as development, etching, the position of each end portion of the teeth, that is, lines $10i_1$, $10i_2$, ... will change, as shown in FIG. 6, depending on the distance from the other pattern 900j. We also call the change "withdrawal" of the teeth of the comb-shaped pattern. In FIG. 6, by the withdrawal of the teeth, the position of each entire pattern 200i is considered to be shifted downward, depending on the distance from the pattern 900j. Since the position of the reference mark 90i does not change, the amount of shift of each comb-shaped first pattern 100i can be easily determined with a conventional optical overlapping-gap inspection device, with the mark as a reference point.

A modification with the shape of a wedge can be employed. That is to say, each line $10I_n$ (n=1, 2, ... ) included in the first pattern 100I can be configured to have a line-width which varies in the longitudinal direction of the line $10I_n$ within the line $10I_n$. Lines $10I_n$ may have a smaller line-width at the end portion 50I (teeth end of a comb) than those of any other portions. As typical example of the above can be illustrated by a comb-shaped pattern where the teeth of the comb are formed in the shape of a wedge with a slender top portion. With the first pattern 100I including lines $10I_1$, $10I_2$, ... of such a shape, that is, the pattern design being such that the line $10I_n$ becomes more slender closer to its top end, the amount of change in the length of the lines $10i_n$ will be apparently enhanced in a pattern transferred. Thus, a change in the length of the lines $10I_n$ can be detected more sensitively, in a more amplified manner, compared with the case in FIG. 5 where the first pattern 100I including the lines $10I_1$, $10I_2$, ... with a constant line-width is employed.

The method for evaluating pattern formation processes with a conventional overlapping-gap inspection device can be also performed using a test pattern in which a plurality of transmittance-variable type first patterns 100C or the first pattern 100E shown in the second embodiment are adopted as the basic unit and are arranged in a matrix.

Since the arrangement of the patterns adopted for the basic unit is entirely similar to that in FIG. 5, illustrations are omitted. For example, when the design of the first pattern 100C shown in FIG. 3 is adopted for the basic unit, a plurality of pair-patterns comprising more than two first patterns 100C disposed in the direction toward which the transmittance changes (in the vertical direction of FIG. 6) are transferred with certain intervals between one another in the direction perpendicular to the direction toward which the transmittance changes (in the horizontal direction of FIG. 6). Here, the pair-pattern corresponds to the pair-pattern $200I_j$ (j=1, 2, ... ) in FIG. 5, and a combination of a plurality of the pair-patterns corresponds to the pattern 500I with a matrix arrangement. The order of transferring the first pattern 100C onto each site does not matter, and it will be sufficient if only the array of transferred patterns with an equivalent matrix arrangement can be finally obtained.

In a similar manner to that illustrated in FIG. 5, the large area pattern is transferred simultaneously with or separately from the transfer of the pair-pattern overlapped therewith, or onto the left side of the pair-pattern located at the left end adjacent to the pair-pattern, or onto the right side of the pair-pattern located at the right end adjacent to the pair-pattern. The pair-pattern corresponds with the other pattern 900J in FIG. 5.

The location of the center of the pair-pattern is previously obtained by adopting any appropriate site in the first pattern 100C for the reference site. For example, in FIG. 5, the reference mark 90I corresponds to the reference site, and once the location thereof is recorded in the photomask pattern, the reference mark corresponding to the reference mark 90i in FIG. 6 can be automatically obtained in the transferred pattern.

By obtaining dependency of the location of the center on the distance from a large area pattern comprising a transparent region transparent to an exposure light using an overlapping-gap inspection device, the evaluation of the pattern formation processes can be performed according to the third embodiment, adopting the first pattern 100C as the basic unit.

In contrast with the case of comb-shaped first pattern 100I, both peripheries of the first pattern 100C in the direction along which transmittance changes may shift, or withdraw, in the transferred first pattern 100c, depending on a given transmittance distribution in the first pattern 100C. The "displacement" in the direction along which the transmittance changes may be defined as the amount of withdrawal at a specific periphery 50 selected previously.

As seen in the second embodiment, a change in transmittance that tends to decrease toward the periphery of the first pattern 100C is preferable because the sensitivity to displacement will be enhanced. Since the evaluation of pattern formation processes is performed by detecting a displacement at either of the end portions 50c of the first pattern 100C, the decrease in transmittance at the periphery is sufficient for the above purpose if it is realized at either of the end portions 50c.

The third embodiment can be realized in a same manner described herein, by using the other pattern 100E as an unit, instead of the pattern 100C.

Fourth Embodiment

In the first to third embodiment, the first pattern 100A, 100G, 100C, 100E, or 100I was provided for each type of the evaluation, and the corresponding other pattern 900B, 900H, 900D, 900F, or 900J, consisting of the transparent region transparent for an exposure light was transferred adjacent to or partly overlapped with each other onto the same transfer medium, respectively. The fourth embodiment is such a method for evaluating pattern formation processes that a transfer medium is uneven, namely, the transfer medium is typically a photoresist 12 applied in a semiconductor manufacturing process, the underlying layer of which has an uneven layered structure.

Figure 12A:
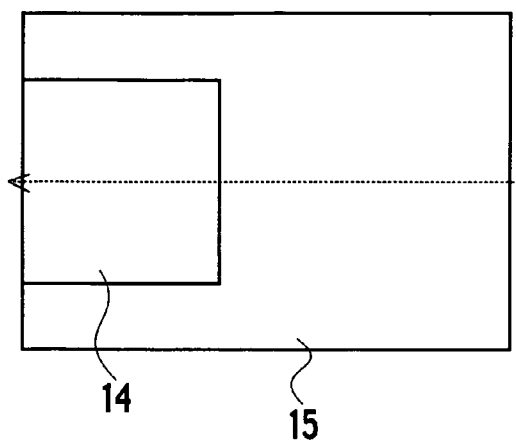
FIGS. 12A-12C show the layered structure of an underlying layer in a medium with an uneven portion, exemplified in the fourth embodiment.
Figure 12B:
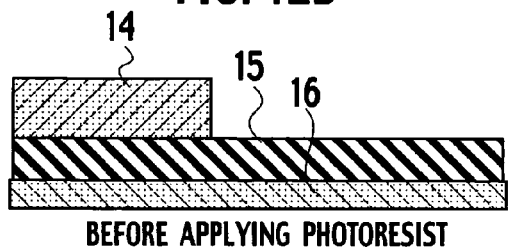
Figure 12C:
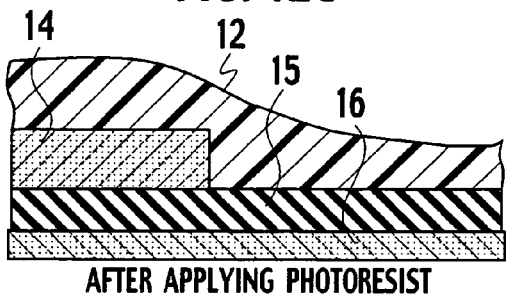

FIGS. 12A-12C show an example of the case above, and the following examination was carried out in order to study the effect of an underlying pattern.

As shown in FIG. 12A, provided was a substrate in which a silicon oxide film 15 of 100 nm thick and a film of polycrystalline silicon 14 of 200 nm thick were formed in this order on a silicon substrate 16. Further, as shown in FIG. 12B, by patterning the film of polycrystalline silicon 14 prepared was the substrate having an uneven polycrystalline silicon film consisting of a large pattern of the film of polycrystalline silicon 14 deposited only on a localized portion of the substrate.

Figure 13A:
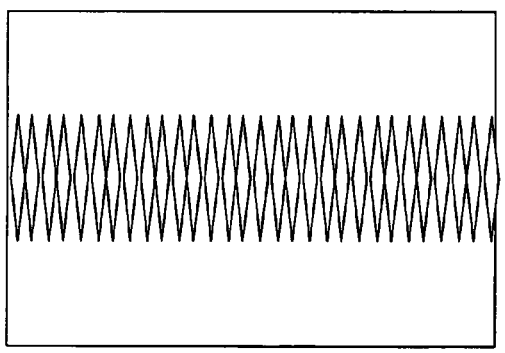
FIG. 13A shows a photomask with a wedge-shaped line pattern.
Figure 13B:
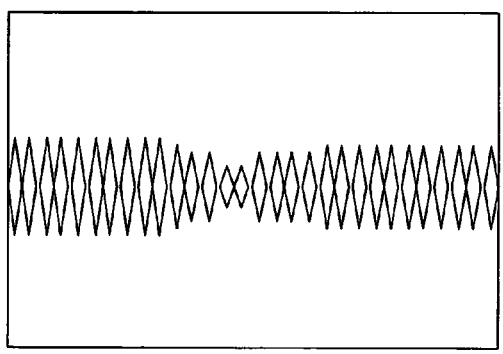
FIG. 13B shows a photoresist pattern by using the photomask with the wedge-shaped line pattern.

Subsequently, as shown in FIG. 12C, an antireflection film (not shown) of 85 nm thick and a photoresist 12 of 200 nm thick were applied in this order on the prepared substrate, and a pattern of the photomask C shown in FIG. 13A was printed thereon using an ArF exposure apparatus. In the photomask C, the wedge-shaped first pattern 100G was arranged in order to obtain sufficient sensitivity to the measurement. Further through PEB and development obtained was the first pattern 100g of the photoresist shown in FIG. 13B.

Figure 13C:
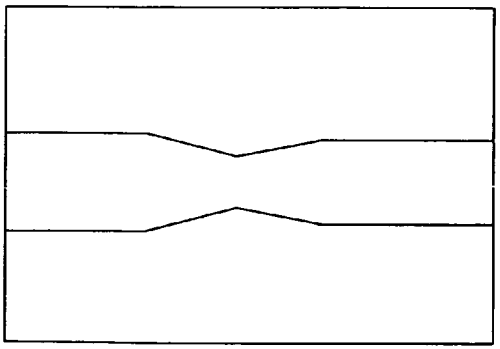
FIG. 13C shows an image observed through an optical microscope, of the photoresist pattern by using the photomask with the wedge-shaped line pattern.
Figure 14A:
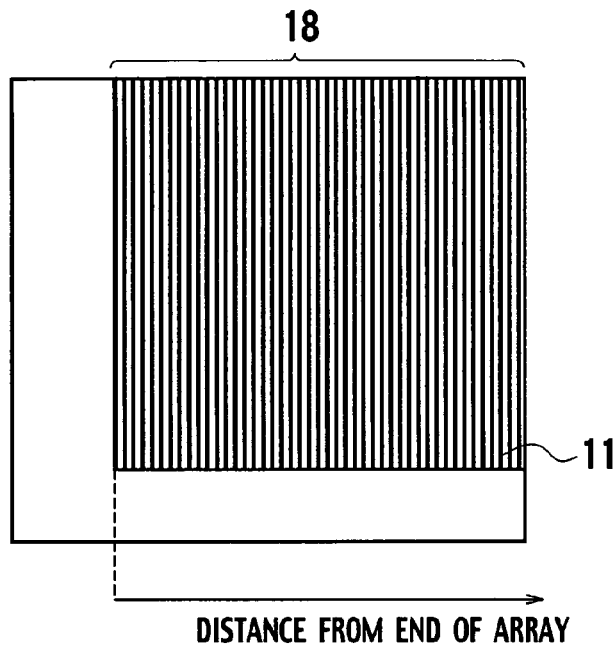
FIG. 14A shows part of a reticule having a device pattern.
Figure 14B:
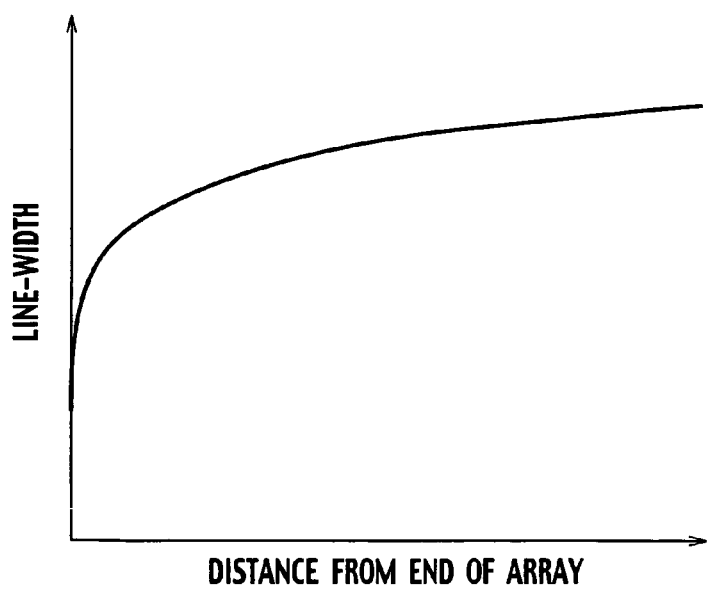
FIG. 14B shows the effect of micro-flare caused by an exposure apparatus on a pattern transferred.

In an entirely similar manner to that illustrated in the first embodiment, length of the lines of the line patterns was measured by observing a contour of the whole photoresist pattern through an optical microscope. FIG. 13C shows a schematic diagram of the image information of the contour obtained in the step above. The first pattern of the photoresist is reduced in width, and it is understood that such a change in the shape of a pattern as above must be anticipated in advance in a lithography process with the uneven underlying layer mentioned above.

The fourth embodiment can be enforced without any difficulty by providing an evaluation pattern which is formed through removing the other pattern 900B, 900H, 900D, 900F, or 900J from the patterns or a combination of the patterns shown in the first to third embodiment, by transferring the pattern onto a transfer medium with uneven portions, and by measuring the amount of displacement or withdrawal of a length depending upon a character of each pattern using an optical means.

According to the fourth embodiment, the effect of a change in film-thickness of a transfer medium with unevenness such as a photoresist film on an uneven substrate can be monitored by means of a simple process.

Fifth Embodiment

Methods for evaluating pattern formation processes according to the first to fourth embodiments may be carried out together with manufacturing of a semiconductor device, by incorporating one of the methods into a pattern formation process of the manufacturing which is to be evaluated.

For example, when a device pattern is formed on a substrate, an evaluation pattern is also formed on another blank site of the substrate. From every one lot on the production line extracted is, for instance, any one substrate such as any one wafer on which both the proper device pattern and the evaluation pattern are formed. The evaluation of the pattern formation process is then carried out for the evaluation pattern, which has been transferred onto a photoresist etc. on the extracted wafer. The order of transferring the device pattern or the evaluation pattern first is not an issue. Either of the two can come out first, or both of them may be transferred at once.

When the pattern formation process to be evaluated is a photolithography process where a photoresist is applied, then exposed to light or further developed, the evaluation pattern is preferably formed together with the device pattern in part (for example, on a dicing line) of the photomask on which the device pattern is formed. The photolithography process is subsequently carried out using the photomask described above. After the photolithography process is finished, or after a latent image is formed through the exposure, the pattern formation process will be evaluated using any one wafer extracted from every lot.

By evaluating pattern formation processes in the manner described above together with the manufacturing process of a semiconductor device, fluctuation of the manufacturing process can be monitored for every lot.

As stated above, the present invention has been described in detail, by presenting various embodiments. However, the present invention is not limited to the illustrated embodiments. It should be understood that various modifications and changes will be conceived within the spirit of the present invention.

What is claimed is:

1. A method for evaluating a pattern formation process, comprising:
   applying a photoresist film on a substrate;
   transferring a first pattern and a second pattern adjacent to or at least partly overlapped with each other to the photoresist film, wherein the first pattern includes a plurality of lines consisting of transparent regions, having the same length and a line-width less than or on the order of wavelengths of visible light, periodically located parallel to one another with end portions aligned on both sides thereof, and the second pattern comprises a transparent region having a larger area compared with each of the lines;

obtaining an image of a first transferred pattern by an optical measurement means, the first transferred pattern formed on the substrate by transferring the first pattern to the photoresist film, the first transferred pattern including a plurality of transferred lines corresponding to the lines; and determining a variation of length of the image in a direction parallel to the transferred lines.

2. The method of claim 1, wherein the first transferred pattern is provided in a plurality of first transferred patterns arranged in rows and columns which are transferred to the photoresist film, and the variation of length of the image is determined for each pair of the first transferred patterns located in each of the rows or the columns.

3. The method of claim 2, wherein, in each of the first transferred patterns, end portions aligned on one side of the plurality of the lines are connected to another line perpendicular to the plurality of the lines, and the variation of length of the image is determined in end portions on the other side of the plurality of the lines.

4. The method of claim 1, wherein each of the lines has varying line-widths depending on portions thereof, and has a smaller line-width in an end portion on the side on which the variation of length of the image is determined, than line-widths of other portions thereof.

5. The method of claim 1, wherein the first transferred pattern formed on the substrate is a latent image in the photoresist film after light exposure and baking treatment or a photoresist pattern after development.

6. A method for evaluating a pattern formation process, the method comprising:

applying a photoresist film on a substrate;

transferring a first pattern and a second pattern adjacent to or at least partly overlapped with each other to the photoresist film, wherein the first pattern includes a plurality of lines consisting of transparent regions, having line-widths less than or on the order of wavelengths of visible light, periodically located parallel to one another in a finite section, and the closer to a periphery of the section the lines are located, the smaller line-widths thereof are, and the second pattern comprises a transparent region having a larger area compared with any of the lines;

obtaining an image of a first transferred pattern by an optical measurement means, the first transferred pattern formed on the substrate by transferring the first pattern to the photoresist film, the first transferred pattern including a plurality of transferred lines corresponding to the lines; and determining a variation of length of the image in a direction perpendicular to the transferred lines.

7. The method of claim 6, wherein the first transferred pattern formed on the substrate is a latent image in the photoresist film after light exposure and baking treatment or a photoresist pattern after development.

8. A method for evaluating a pattern formation process, comprising:

applying a photoresist film on a substrate with an uneven surface;

transferring a first pattern to the photoresist film, wherein the first pattern includes a plurality of lines consisting of transparent regions, having the same length and a line-width less than or on the order of wavelengths of visible light, periodically located parallel to one another with end portions aligned on both sides thereof;

obtaining an image of a first transferred pattern by an optical measurement means, the first transferred pattern formed on the substrate by transferring the first pattern to the photoresist film, the first transferred pattern including a plurality of transferred lines corresponding to the lines; and determining a variation of length of the image in a direction parallel to the transferred lines.

9. The method of claim 8, wherein the first transferred pattern is provided in a plurality of first transferred patterns arranged in rows and columns are transferred to the photoresist film, and the variation of length of the image is determined for each pair of the first transferred patterns located in each of the rows or the columns.

10. The method of claim 9, wherein, in each of the first transferred patterns, end portions aligned on one side of the plurality of the lines are connected to another line perpendicular to the plurality of the lines, and the variation of length of the image is determined in end portions on the other side of the plurality of the lines.

11. A method for evaluating a pattern formation process, the method comprising:

applying a photoresist on a substrate with an uneven surface;

transferring a first pattern to the photoresist film, wherein the first pattern includes a plurality of lines consisting of transparent regions, having line-widths less than or on the order of wavelengths of visible light, periodically located parallel to one another in a finite section, and the closer to the periphery of the section the lines are located, the smaller line-widths are;

obtaining an image of a first transferred pattern by an optical measurement means, the first transferred pattern formed on the substrate by transferring the first pattern to the photoresist film, the first transferred pattern including a plurality of transferred lines corresponding to the lines; and determining a variation of length of the image in a direction perpendicular to the transferred lines.

12. A method for manufacturing a semiconductor device, the method comprising:

selecting a target exposure apparatus from among a plurality of exposure appratuses by repeating processing for each of the exposure appratuses including:

applying a photoresist film on a substrate;

transferring a first pattern to the photoresist film, wherein the first pattern includes a plurality of lines consisting of transparent regions, having the same length and a line-width less than or on the order of wavelengths of visible light, periodically located parallel to one another with end portions aligned on both sides thereof;

obtaining an image of a first transferred pattern by an optical measurement means, the first transferred pattern formed on the substrate by transferring the first pattern to the photoresist, the first transferred pattern including a plurality of transferred lines corresponding to the lines; and determining a variation of length of the image in a direction parallel to the line;

applying a target photoresist film on a target substrate;

transferring a mask pattern to the target photoresist film by using the target exposure apparatus; and selectively etching the target substrate using the transferred mask pattern transferred to the photoresist film as a mask, to form a device pattern in the target substrate.

13. The method of claim 12, wherein the first transferred pattern is provided in a plurality of first transferred patterns arranged in rows and columns which are transferred to the photoresist film, and the variation of length of the image is determined for each pair of the first transferred patterns located in each of the rows or the columns.

14. The method of claim 13, wherein, in each of the first transferred patterns, end portions aligned on one side of the plurality of the lines are connected to another line perpendicular to the plurality of the lines, and the variation of length of the image is determined in end portions on the other side of the plurality of the lines.

15. The method of claim 12, wherein each of the lines has varying line-widths depending on portions thereof, and has a smaller line-width in an end portion on the side on which the variation of length of the image is determined, than line-widths of other portions thereof.

16. The method of claim 12, wherein the first transferred pattern formed on the substrate is a latent image in the photoresist film after light exposure and baking treatment or a photoresist pattern after development.

* * * * *